United States Patent [19]

Rockwell

[11] Patent Number: 5,072,185
[45] Date of Patent: Dec. 10, 1991

[54] WIRE HARNESS MODULAR INTERFACE ADAPTER SYSTEM AND TESTING APPARATUS

[75] Inventor: Kenneth N. Rockwell, Yorba Linda, Calif.

[73] Assignee: Cablescan, Inc., Orange, Calif.

[21] Appl. No.: 612,094

[22] Filed: Nov. 13, 1990

[51] Int. Cl.[5] ............................................. G01R 31/02
[52] U.S. Cl. ........................................ 324/539; 29/593
[58] Field of Search ...................... 324/539, 66, 158 F, 324/158 P; 29/593, 705; 439/353, 354, 289

[56] References Cited

U.S. PATENT DOCUMENTS

| | | |
|---|---|---|
| 4,168,873 | 9/1979 | Luna . |
| 4,183,609 | 1/1980 | Luna . |
| 4,285,118 | 8/1981 | Peppler et al. ........................ 29/593 |
| 4,321,532 | 3/1982 | Luna . |
| 4,859,953 | 8/1989 | Young et al. ........................ 324/539 |

Primary Examiner—Jack B. Harvey
Attorney, Agent, or Firm—William W. Haefliger

[57] ABSTRACT

A wire harness testing apparatus which comprises a universal interface module having interconnect terminals, the module electrically connected to a test system; a group of wire harness mating connectors; and a series of modular interface adapters comprising a group of cables, standardized connectors respectively at one end of each cable, and connectible to the universal interface interconnect terminals, and special connectors at the other ends of the cable, respectively, and connectible to the wire harness mating connectors; the cables extending in electrically parallel relation.

17 Claims, 6 Drawing Sheets

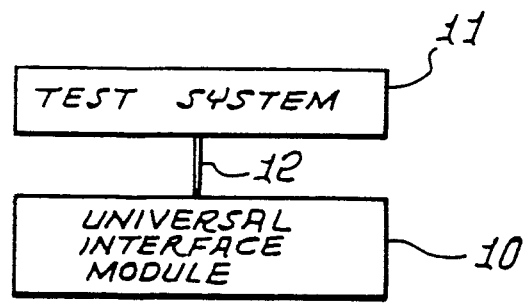
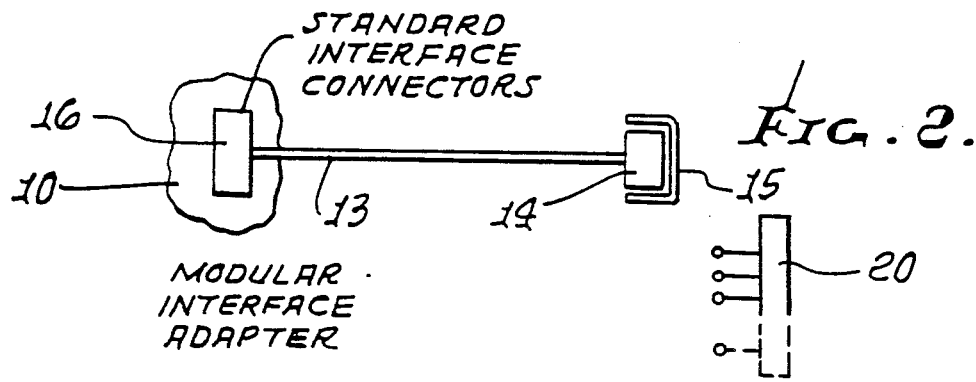
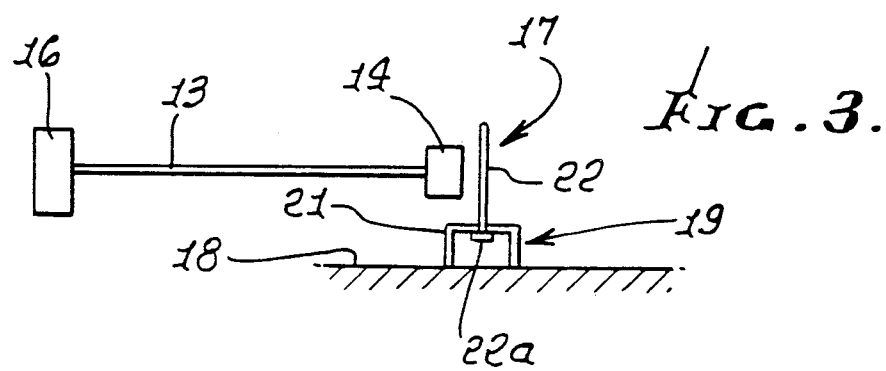
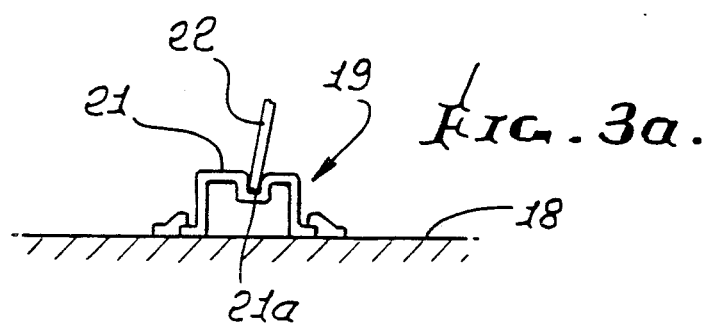

5,072,185

WIRE HARNESS MODULAR INTERFACE ADAPTER SYSTEM AND TESTING APPARATUS

BACKGROUND OF THE INVENTION

This invention relates generally to the testing of wire harnesses, and more particularly, it concerns a novel modular interface adapter system used to intercouple a universal interface module associated with a test system, and a group of wire harness mating connectors.

Continuity testers are used to verify that manufactured wire harnesses meet designed electrical specifications. Continuity testers are also used in assembly processes to provide assembly information verifying that the harness is being assembled correctly. If an error is made, the assembler is immediately notified, allowing error correction before continuing. This eliminates the cost of rework, and also reduces training time. However, before a continuity tester can be used, it must be connected to the harness and programmed with a wire list. If the tester is used in the assembly process, it must be further programmed with the assembly information. The process of connecting the tester to the wire harness, and the programming of the tester, represent a substantial investment in time and money, often exceeding (over a period of time) the cost of the tester. This investment prevents many manufacturers from installing testers, especially for small production quantities or sums.

An acceptable, usable interconnect provides mating connectors to the wire harness being tested. The interconnect wiring has mating connectors to connect to the harness under test on one end, and connectors that plug into the tester on the other end. The interconnect electrically connects the harness under test to the tester. In test applications, a fixture is sometimes required to physically hold the harness while the harness connectors are plugged into the mating connectors in the interconnect. The fixture is usually built to conform to the physical layout of the harness. In assembly applications a fixture is required to hold the connectors during soldering, crimping, etc., and to show the routing path of the wires as they are laid in place. This requires a custom built, one-of-a-kind fixture for each type of harness to be manufactured. Since the fixtures are custom built, their costs are high.

Before testing can be performed, the equipment must be programmed with the wire list. The wire list specifies the electrical placement of the ends of the wires in the wire harness (normally a specific pin in a connector). For build applications, the wire list is normally arranged in the order that the harness will be assembled. For test applications, the wire list order is not important. Most test equipment can electrically scan the wiring harness and determine the wire list by performing a "Learn-Known-Good" function. During Learn-Known-Good, the tester determines the order of the wire list. Tester defined wire list orders are acceptable for test applications, but for assembly applications, the build order is important and therefore requires that the wire list be entered through a keyboard.

The second part of the program is the cross reference or user label list. The wire list specifies the wiring relationship between the ends of the wires and the pins of the harness connectors. The cross reference list is the wiring relationship of the interconnect. It specifies the placement between the pins of the mating connectors and the test points of the tester. This part of the program has to be entered through a keyboard and is programmed after the interconnect is built. Without the cross reference list, the tester would display test results relative to test points and not to actual wire harness locations.

There is need for improvement or improvements in apparatus and techniques used for testing wire harnesses, allowing more rapid, accurate and reliable testing, and reduced test apparatus cost.

SUMMARY OF THE INVENTION

It is a major object of the invention to provide apparatus and method that meets the above needs. Basically, the apparatus of the invention includes:

a) a universal interface module having interconnect terminals, the module electrically connected to a test system, b) a group of wire harness mating connectors, and c) a series of modular interface adapters comprising
 i) a group of cables,
 ii) standardized connectors respectively at one end of each cables, and connectible to the universal interface interconnect terminals, and
 iii) special connectors at the other ends of the cables, respectively, and connectible to the wire harness mating connectors, d) the cables typically extending in electrically parallel relation.

As will appear, mounting brackets are typically employed to mount the respective wire harness mating connectors; and the brackets have removable bases to allow adapter cable movement between different work surfaces. In this regard, the brackets also typically may include mounting plates that attach to the special connectors, the plates removably connected to the removable bases. The special connectors normally have different configurations.

In accordance with a further aspect of the invention, when removing an adapter cable from the work surface, the connector mounting plate can be disconnected from the mounting base, leaving the base permanently attached to the work surface. This permits the adapter cable to be used on another wire harness and work surface without disturbing the physical setup of the original work surface. The connector mounting plate can then be attached to a new mounting base on a different work surface. The use of modular interface adapters and modular mounting brackets allows the fixturing investment to be spread among several wire harnesses.

It is another object of the invention to provide an improved testing system as referred to, and wherein one set of the removable bases is carried by one work surface, and another set of the removable bases is carried by another work surface.

As will appear, the universal interface connector constitutes a continuous connector design allowing the standard interface connectors to be stacked side-by-side (end-to-end) without skipping pins in the continuous connector. This method of stacking connectors eliminates the problem of creating groups of unused interface pins typically found in fixed pin connector approaches. The continuous stacking connector approach reduces the test point requirement of the test system.

Another object of the invention is to provide a test system connected to the universal interface module through a set of standard one-to-one interface cables. For example, for each interface point in the continuous universal connector, there is a corresponding point from the tester. For a continuous universal connector with 512 points, a set of cables with 512 points from the tester is used, as facilitated by the interface modules stacked together in side-by-side relation. Furthermore, the points are connected in consecutive order so that test points 1 through 512 from the tester are connected to pins 1 through 512 in the continuous connector. The test system is capable of making continuity measurements from each point and displaying the results.

An additional object is to provide for use of modular fixture software to reduce programming costs. By using modular interface adapters, it is possible to create connector libraries and to use this information during wire list, and cross reference list programming to greatly reduce programming time and programming errors.

The software program has two purposes: to create and maintain modular interface adapters libraries, and to generate wire list programs utilizing these libraries.

As new interface adapters are created, wiring information and identification code are added to the library. When a new wire list program is created, the codes for each adapter of the wire harness are entered. The software program then accesses the libraries and extracts the necessary information for each adapter, such as number of pins, how the pins are numbered, how the pins are labeled, etc. For build applications, the optimum build order for the connector can also be specified. The optimum build order may proceed from the center out, for a round connector, or from the bottom row of pins toward the top of the connector. The build information may also include manufacturing process information and graphics that can be displayed during harness fabrication.

The software program allows interaction so that the information from the library can be temporarily modified for the particular wire harness currently being programmed. At times the build order, or the cross references for the connectors, may be altered.

The modular fixture software program is written to run on, i.e., for use with, a personal computer. After the wire list is programmed, it is typically loaded into the tester through floppy disks, or through an electrical connection to the computer.

These and other objects and advantages of the invention, as well as the details of an illustrative embodiment, will be more fully understood from the following specification and drawings, in which:

DRAWING DESCRIPTION

FIG. 1 is a schematic showing of elements;

FIG. 2 is a schematic showing of an interface adapter;

FIG. 3 is a schematic showing of a connector mounting bracket;

FIG. 3a is an enlarged view of a connection;

DETAILED DESCRIPTION

Figure 4:
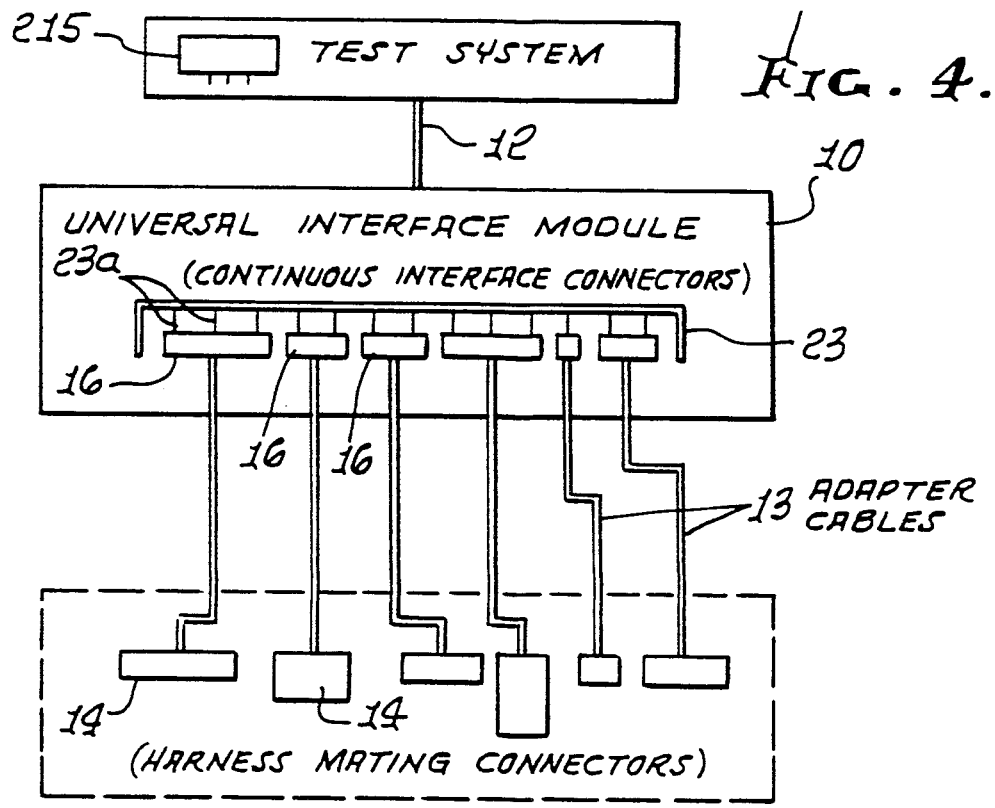
FIG. 4 is a schematic showing of a system, and with multiple adapter cables seen.

As referred to above, the system herein detailed can be described as a modular interface adapter and programming system for connecting wiring harnesses to a continuity tester/assembly aid, and the programming of the tester with a test program using stored information created for each of the modular interface adapters. The system provides fabricating modular interface adapters for each type of connector contained in a group of wire harnesses. These modular interface adapters are fabricated in such a manner to conform to a specific wiring format. The information associated with each modular interface adapter is then stored in a connector library. Information from the connector library is then accessed to automate the generation for the tester's wire harness programs.

The modular interface adapter system comprises four major elements: 1) Universal Interface Module, 2) Modular Interface Adapters, 3) Connector Mounting Brackets, and 4) Programming Software.

Universal Interface Module

The universal interface module 10, as seen in FIG. 1, connects to the test system 11 and provides interfacing to the modular interface adapters. The universal interface module is basically a large test point break-out fixture providing a fast means for changing test setups when testing different types of wire harnesses. Tester interface cabling appears at 12.

Modular Interface Adapters

A modular interface adapter, as seen in FIG. 2, consists of an interface cable 13 and two connectors. One end of the cable has a connector 14 mating to a specific wire harness connector 15. The other end of the cable has a standardized connector 16, and it electrically connects the wire harness mating connector to the universal interface module 10.

Connector Mounting Bracket

As seen in FIG. 3, the connector 14 in the form of a mounting bracket 17 mounts the harness mating connector 14 to a work surface 18. The mounting brackets have removable bases 19 to allow the adapter cables 13 to be easily moved between work surfaces 18 when not in use. Each base is U-shaped, and has a web 21 carrying a mounting plate 22.

The mounting brackets are also modular so that the adapter cable can be quickly set up and removed from the work surface. Each bracket consists of two parts, a connector mounting plate 22 and a mounting base 19. The connector mounting plate attaches to the mating connector 14 of the adapter cable. The mounting base attaches to the connector mounting plate and holds it to the work surface. When removing an adapter cable from the work surface 18, the connector mounting plate 22 can be disconnected from the mounting base 21 leaving the base permanently attached to the work surface. See disconnecting element 22a. Elements 21 and 22 may have tongue and groove connection. This permits the adapter cable to be used on another wire harness and work surface without disturbing the physical setup of the original work surface. The connector mounting plate can then be attached to a new mounting base on a different work surface. The mounting bases typically have variously angled slots 21a to receive the plates. See FIG. 3a. This allows the connector plates to be held at the proper angle on a particular work surface. The use of modular interface adapters and modular mounting brackets allows the fixturing investment to be spread among several wire harnesses.

Programming Software

Programming software 20 (see FIG. 2) maintains wiring and configuration information for each modular interface adapter. Using this information, the software generates setup instructions, cross reference information, wire harness assembly procedures, and test programs.

There are a number of cost considerations when justifying the installation of an electronic build-aid and continuity tester. These considerations are listed below:

Considerations for Implementing Electronic Build-Aids

1. Fixturing cost?
2. Number of harnesses to be produced.
3. Will the fixture be used again?
4. Programming cost?
5. Will changes in production procedures be required?
6. Are programming and fixturing personnel available?
7. Fixture maintenance costs.
8. Cost and time to implement engineering changes.
9. Initial equipment costs.

Fixturing costs are normally justified directly to the job since fixtures are built for a specific wire harness. Since the equipment is normally capitalized, its cost can be justified based on total usage.

The modular interface adapter system reduces fixturing and programming costs. The system is designed to allow the majority of the fixturing components to be utilized on more than one harness. By creating modular interfaces, the information pertaining to the adapters can be used in programming every wire list that uses the preprogrammed system employing interface adapters. This reduces programming time since the same information is accessed more than once.

FIG. 4 shows a series of modular interface adapters 13 terminating into the universal interface module 10 via standard interface connectors 16. The harness mating connectors 14 are shown in various configurations.

The universal interface module 10 contains interface connectors 23 to terminate the standard interface connector ends of the adapters. The universal interface module is in turn connected to a test system 11. The universal interface connector shown is a continuous connector design allowing the standard interface connectors 16 to be stacked side by side without skipping pins in the continuous connector. This method of stacking connectors 16 eliminates the problem of creating groups of unused interface pins typically found in fixed pin connector approaches. The continuous stacking connector approach reduces the test point requirement of the test system. Pins are shown schematically at 23a.

Figure 5:
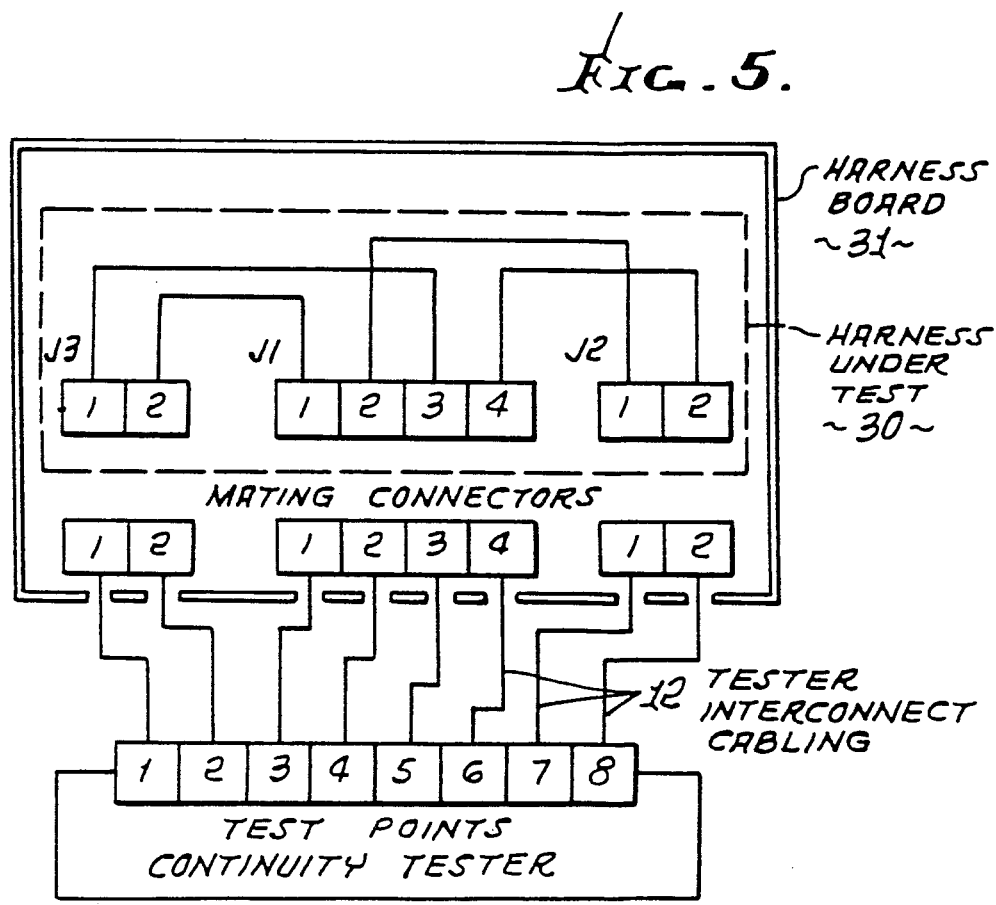
FIG. 5 is a schematic showing of a typical harness under test.

Shown in FIG. 5 is a simple four wire harness. As seen, the elements include the harness 30 to be tested, a harness board 31 with mating connectors, the tester interconnect cabling, and the continuity tester. The adapter system of the present invention is not included in FIG. 5. The harness under test has four wires and three connectors. As a naming convention, J1, J2, and J3 denote the connectors. Pin numbers (in the boxes) are denoted by their associated connector name followed by a dash number. Pin one in connector J1 would therefore be named J1-1.

Shown below is the wire list program as "learned" by the tester with a "Learn-Known-Good" function. Since the program was generated with the learn function, the cross reference list is empty. The wire list is therefore shown with tester point numbers and not referenced with the wire harness connector/pin names.

| WIRE LIST PROGRAM WITHOUT CROSS REFERENCE PROGRAMMED | | | |
|---|---|---|---|
| WIRE LIST | | CROSS REFERENCE | |
| From | To | Point # | Label |
| 1 | 5 | 1 | |
| 2 | 3 | 2 | |
| 4 | 7 | 3 | |
| 6 | 8 | 4 | |
| | | 5 | |
| | | 6 | |
| | | 7 | |
| | | 8 | |

During test, if a short is found between two wires, the tester would display the short using tester point numbers. Without the cross reference list, a short would be displayed as a short between two tester point numbers and not the actual points on the harness. Therefore, if a short was found between the two points on the wire harness J1-1 and J1-2, the tester's display would show:
Short 3 4

Shown below is same wire list program with the cross reference list entered. The cross reference list specifies where each tester point number is located on the mating connectors. With the cross reference list programmed, the wire list can also be programmed using connector/pin references.

| WIRE LIST PROGRAM WITH USER LABELS PROGRAMMED | | | |
|---|---|---|---|
| WIRE LIST | | CROSS REFERENCE | |
| From | To | Point # | Label |
| J3-1 | J1-3 | 1 | J3-1 |
| J3-2 | J1-1 | 2 | J3-2 |
| J1-2 | J2-1 | 3 | J1-1 |
| J1-4 | J2-2 | 4 | J1-2 |
| | | 5 | J1-3 |
| | | 6 | J1-4 |
| | | 7 | J2-1 |
| | | 8 | J2-2 |

The wire harness program now shows both the wire list and the cross reference list (user labels) programmed. Shown below is the same short as before but with the cross reference list programmed.
Short J1-1 J1-2

For build applications, the line number order that each wire is listed in the wire list determines the assembly order. Therefore the first wire to be assembled would be J3-1 to J1-3, and the second wire would be J3-2 to J1-1. The wire list would be rearranged to optimize the assembly process.

In test applications, the cross reference list is optional. Although when an error is displayed, the operator must rely on documentation to locate the physical location of the error. The cross reference list is necessary for build application unless the harness is very small and the tester point numbers are marked on the harness board. After the cross reference list is programmed, it is seldom necessary to change it; only when the interconnect is revised to conform with changes in the wire harness.

The wire list is changed when an electrical change is made to the harness or when the build order needs revising. For test application, the tester can "learn" the new configuration. For build applications, the wire list changes must be edited through the keyboard.

Figure 6:
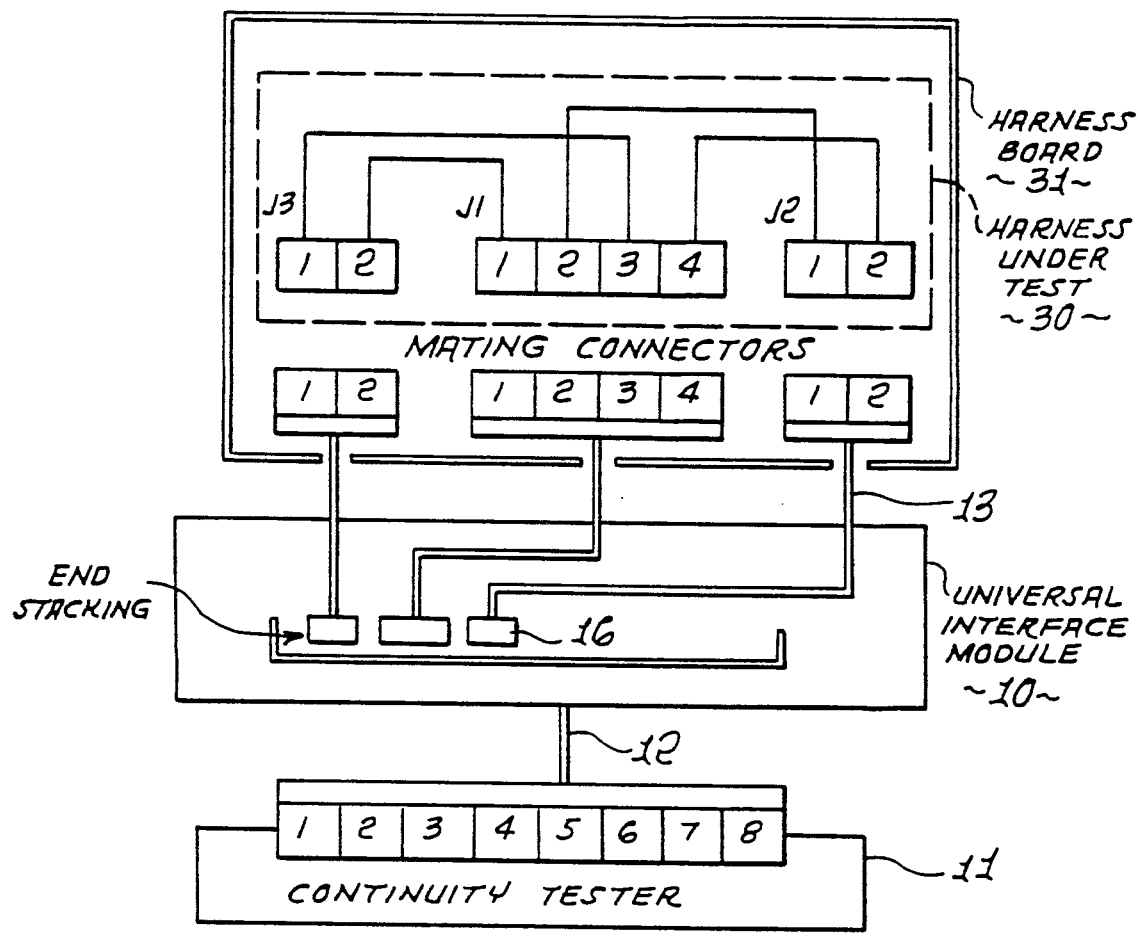
FIG. 6 is a schematic showing of a complete modular interface system.

A complete modular interface system is seen in FIG. 6.

Figure 7:
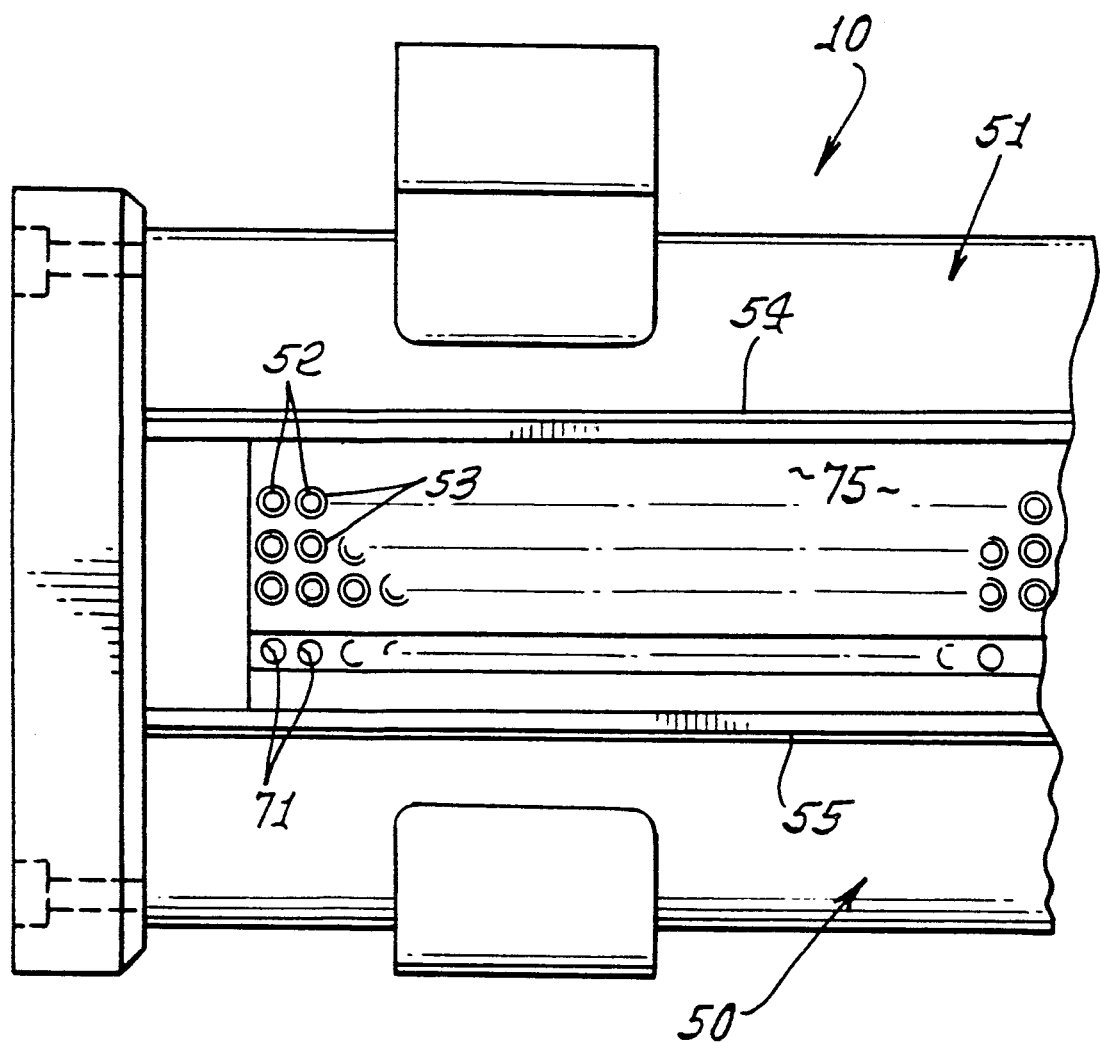
FIG. 7 is a frontal view of a universal interface module.

Referring to FIG. 7, it shows one form of universal interface module 10 having a housing extrusions 50 and 51 defining a front face for panel 75. Spring probe connector pins 52 project outwardly from the panel, and have contact heads 53. The pins and heads are arranged in vertical column, and horizontal rows, as shown. Above and below the probe pins and heads are attachment rails 54 and 55 that extend horizontally, allowing end-to-end stack-attachment of multiple, different size (in horizontal dimension) modular interface adapters 13 to the unit 10.

Figure 8:
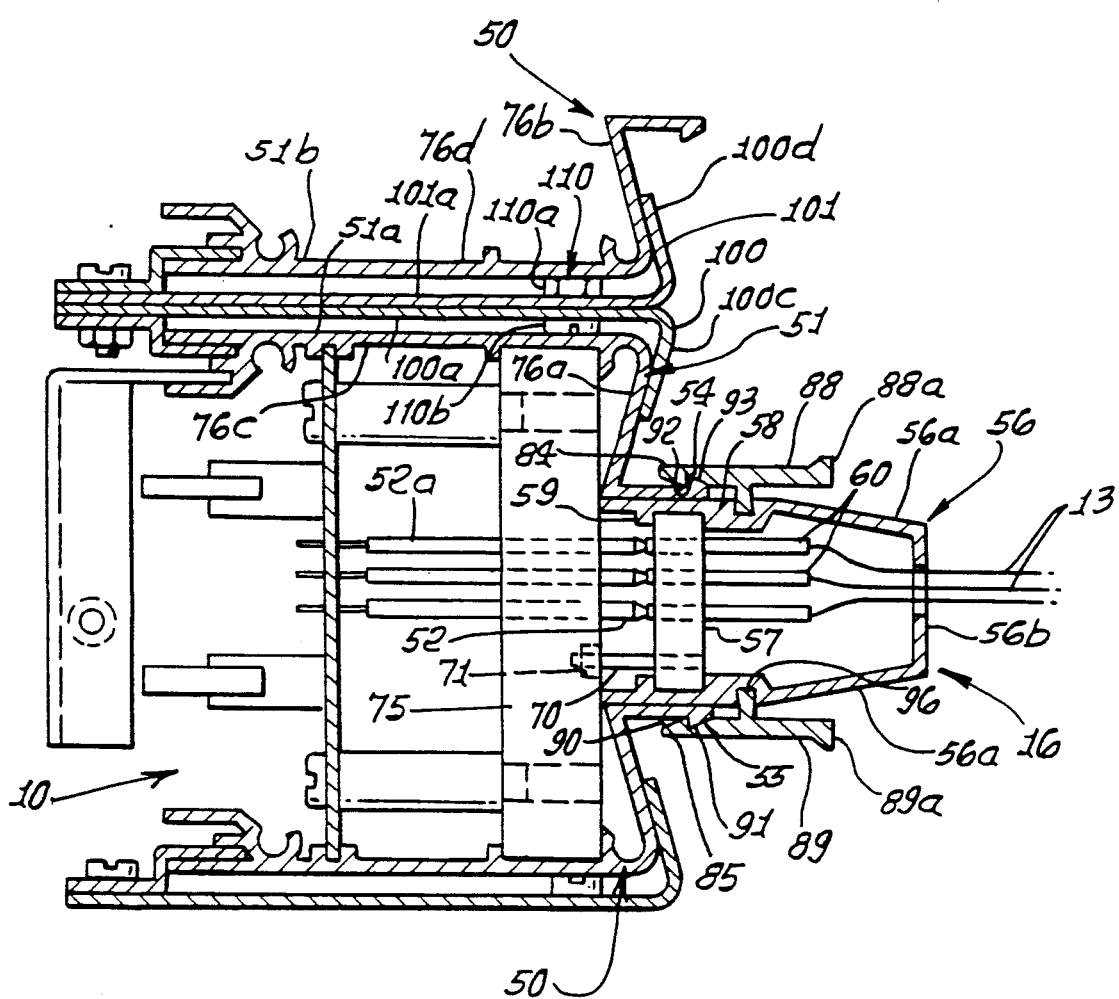
FIG. 8 is a section taken in elevation showing a module interface adapter connection to the universal interface module of FIG. 7.

Extending the description to FIG. 8, the adapter 16 includes a channel-shaped extrusion 56 having vertically spaced legs 56a, and end web 56b interconnecting the legs. A panel 57 carried between extrusion ribs 58 and 59 supports horizontally elongated pins 60 extending in rows and columns, to align with pins 52 when the adapter 13 is connected to the extrusions 50 and 51. The pins 60 defines end contacts 61 engageable by tapered heads 53, to push the heads and pins 52 leftwardly.

Figure 9:
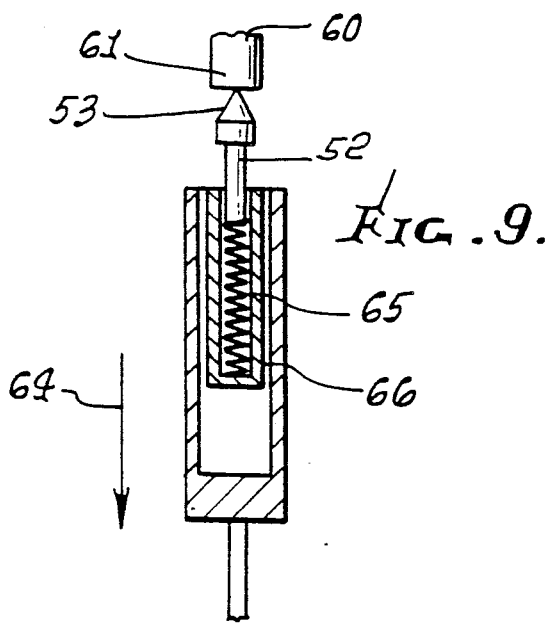
FIG. 9 is a section showing a spring probe.

FIG. 9 shows such engagement, the coil spring 65 resisting pushing of head 53 in inward direction 64. A tubular guide 66 guides movement of pin 52.

Also carried by panel 57 are two locater pins 70 to penetrate locater openings 71 in a block 75 fixed to extrusions 50 and 51 in module 10, that block carrying pins 52 and sockets 52a. Pins 70 may be carried or spaced at opposite ends of the panel 57 (i.e., in direction 73, normal to the plane of FIG. 8). See also arrow 73 in FIG. 10. Openings 71 are typically located below each column of pins 52, whereby the adapters may be of varying length, but each is connectible to the unit 10 at lateral intervals or spacings therealong (in direction 73) determined by the uniform spacings of the columns of pins 52. See FIG. 10. This also facilitates endwise stacking, in direction 73, of different modules 16 of different lateral lengths, to make maximum use of the provided connector pins 52. See modules indicated at 16a and 16b in FIG. 10 and modules indicated at 16c and 16d in FIG. 11.

Figure 10:
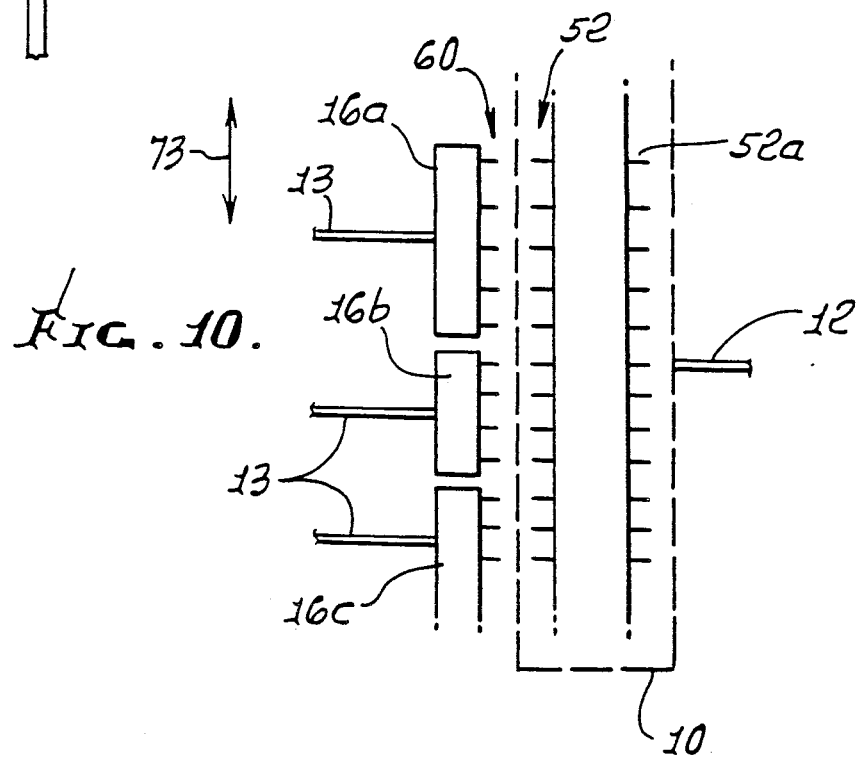
FIG. 10 is a schematic showing of end-to-end stacking of multiple module interface adapters connected to a universal interface module.

Software 215, connected within test system 11, as in FIG. 4, is programmed to define a correspondence (wiring relationship) between the terminals at the mating connectors 14 (in FIG. 4) and the standardized connectors 16. In this process, the order in which the connectors 16 are stacked end-to-end, as per FIG. 10, is taken into account. By defining the same stacking order and the cabling 13, the terminal relationship as between tester 11 and the mating connector 14 is defined. Note that stacking is such that all pins at 52a are used.

The retractable attachment of the extrusion 56 to extrusions 50 and 51 is facilitated through use of the two rails 54 and 55 previously referred to. Jaws 84 and 85 carried by levers 88 and 89 are connected by cam action to the rails when the extrusion 56 is moved into place, as shown in FIG. 8. Such levers 88 and 89 have integral fulcrum connections at 96 to the legs 56a, whereby upper lever 88 is spring biased in a counterclockwise direction, and lower lever 89 is spring biased in a clockwise direction. Cam surfaces 90 on the jaws ride over the cam surface 91 on the rails, and the retainers (projections) 92 on the rails snap into grooves 93 in the levers to hold the module 16 to the unit 10, as shown. Lever extensions 88a and 89a may be squeezed, manually, toward one another to pivot the levers about their fulcrums, and to release the jaws from the rails, as during disconnection (separation) of the module 16 from the unit 10.

It will be noted in FIG. 8 that two or more of the interface module units 10 may be vertically stacked on top of one another, as by retainer-clips 100 and 101, which are L-shaped to have arms 100a and 101a parallel to the top and bottom walls 51a and 51b of the stacked housings 51, and arms 100c and 100d that engage the upper and lower wall extents 76a and 76b of the extrusion or extrusions 51. Arms 100a and 101a are interconnected by fasteners 110 having heads 110a and 110b acting to space the units 10 vertically, as by engagement with walls 76c and 76d.

Figure 11:
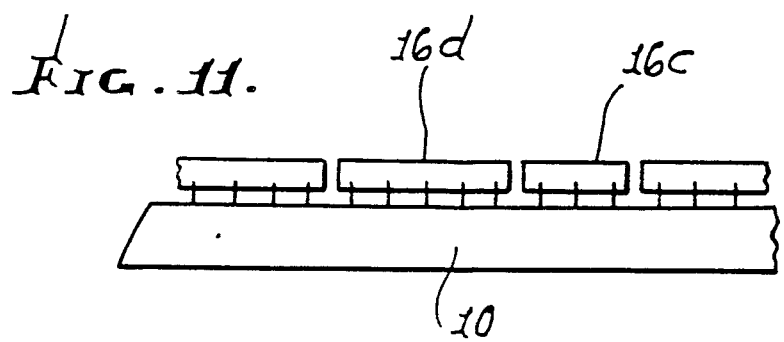
FIG. 11 is a view like FIG. 9 showing a different arrangement of modular interface adapters stacked in end-to-end relation to the universal interface module to which they are connected.

FIGS. 10 and 11 shows end-to-end stacking of different modules 16, the modules in FIG. 10 having different lengths and positions laterally along the unit 10, as compared with the modules 16 in FIG. 11.

We claim:

1. In wire harness testing apparatus, the combination comprising:
  a) a universal interface module having interconnect terminals, said module electrically connected to a test system,
  b) a group of wire harness mating connectors, and
  c) a series of modular interface adapters comprising
    i) a group of cables,
    ii) standardized connectors respectively at one end of each cable, and connectible to said universal interface interconnect terminals, and
    iii) special connectors at the other ends of said cables, respectively, and connectible to said wire harness mating connectors,
  d) said cables extending in electrically parallel relation,
  e) said terminals extending in columns and rows, said modular interface adapters stacked end-to-end lengthwise of said rows with said interface adapter standardized connectors engaging said universal interface module terminals,
  f) certain interface adapters having different lengths, lengthwise of said rows, and being arbitrarily located relative to one another,
  g) said modular interface adapters having manually releasable clips thereon, and said universal interface module having rail means thereon extending in the direction of said terminal rows, said clips releasably attached to said rail means, and said clips having the form of fulcrum supported levers.

2. The combination of claim 1 including mounting brackets mounting said respective wire harness mating connectors.

3. The combination of claim 2 wherein said brackets have removable bases to allow adapter cable movement between different work surfaces.

4. The combination of claim 3 wherein said brackets also include mounting plates that attach to said special connectors, said plates removably connected to said bases.

5. The combination of claim 3 wherein one set of said removable bases is carried by one work surface, and another set of said removable bases is carried by another work surface.

6. The combination of claim 1 wherein said special connectors have different configurations.

7. The combination of claim 4 wherein said plates and bases have tongue and groove interfit.

8. The combination of claim 1 wherein said universal interface module includes a continuous interface connector associated with said interconnect terminals.

9. The combination of claim 8 wherein said terminals comprise pins arranged in a uniform sequence to receive said standardized connectors having different configurations.

10. The combination of claim 1 including a test system connected with said terminals via cabling.

11. The combination of claim 1 wherein said universal interface module terminals comprise:
   i) tubular guides
   ii) pins slidable in said guides, said pins having heads engaging the ends to said interface adapter standardized connectors
   iii) and springs connected with said guides and yieldably urging said heads toward said interface adapter standardized connectors.

12. The combination of claim 11 wherein each said module interface adapter includes a channel-shaped frame having upper and lower legs, said levers pivotally attached to said legs, said levers having jaws with cam surfaces engageable with cam surfaces defined by said rail means whereby said jaws ride onto said rail means and lock thereto, the jaws biased into locking relation with said rail means, the legs engageable with structure associated with the interface module to limit advancement of said standardized connectors toward said interface module pins.

13. The combination of claim 12 wherein each adapter includes a panel carried by said channel-shaped frame, and said connectors are carried by the panel and aligned with said terminals by guided engagement of said channel-shaped frame with said legs.

14. The combination of claim 1 including interfitting locater pin and socket elements associated with said modular interface adapter and said universal interface module.

15. The combination of claim 1 including multiple of said universal interface modules, and means thereon for retaining said multiple interface modules in assembled relation with the rows of terminals thereof extending in parallel relation.

16. The combination of claim 1 including control circuitry operatively connected with said adapter standardized connectors and with said universal interface module terminals.

17. The combination of claim 1 including software operatively connected and programmed to define a wiring correspondence relationship between terminals at the mating connectors and at the standardized connectors.

* * * * *

UNITED STATES PATENT AND TRADEMARK OFFICE
CERTIFICATE OF CORRECTION

PATENT NO. : 5,072,185
DATED : Dec. 10, 1991
INVENTOR(S) : Kenneth N. Rockwell and John C. Norburg It is certified that error appears in the above-identified patent and that said Letters Patent is hereby corrected as shown below:

On the title Page, [75] Inventors: should read:

--Kenneth N. Rockwell, Yorba Linda, California and
John C. Norburg, Orange, California--

Signed and Sealed this

Sixth Day of April, 1993

Attest:

STEPHEN G. KUNIN

*Attesting Officer*   *Acting Commissioner of Patents and Trademarks*